United States Patent
Imai

(10) Patent No.: US 9,368,707 B2
(45) Date of Patent: Jun. 14, 2016

(54) MOUNTING SUBSTRATE AND LIGHT-EMITTING DEVICE USING THE SAME

(71) Applicants: CITIZEN ELECTRONICS CO., LTD., Yamanashi-ken (JP); CITIZEN HOLDINGS CO., LTD., Tokyo (JP)

(72) Inventor: Sadato Imai, Yamanashi-ken (JP)

(73) Assignees: CITIZEN ELECTRONICS CO., LTD., Yamanashi-Ken (JP); CITIZEN HOLDINGS CO., LTD., Tokyo (JP)

( * ) Notice: Subject to any disclaimer, the term of this patent is extended or adjusted under 35 U.S.C. 154(b) by 0 days.

(21) Appl. No.: 14/647,161

(22) PCT Filed: Mar. 14, 2013

(86) PCT No.: PCT/JP2013/001685
§ 371 (c)(1),
(2) Date: May 26, 2015

(87) PCT Pub. No.: WO2014/083714
PCT Pub. Date: Jun. 5, 2014

(65) Prior Publication Data
US 2015/0325761 A1    Nov. 12, 2015

(30) Foreign Application Priority Data
Nov. 27, 2012  (JP) .................. 2012-258102

(51) Int. Cl.
*H01L 33/62*     (2010.01)
*H01L 23/14*     (2006.01)
(Continued)

(52) U.S. Cl.
CPC .............. *H01L 33/62* (2013.01); *H01L 23/142* (2013.01); *H01L 23/3736* (2013.01);
(Continued)

(58) Field of Classification Search
None
See application file for complete search history.

(56) References Cited

U.S. PATENT DOCUMENTS

2007/0102722 A1    5/2007  Ishizaka et al.
2007/0217221 A1    9/2007  Lee et al.
(Continued)

FOREIGN PATENT DOCUMENTS

DE    20 2011 050 976    1/2013
EP    2 479 233          7/2012
(Continued)

OTHER PUBLICATIONS

Notice of Reasons for Refusal issued Aug. 26, 2015, in corresponding Japanese Application No. 2014-549755 with English translation.
(Continued)

*Primary Examiner* — William Coleman
*Assistant Examiner* — Kien Ly
(74) *Attorney, Agent, or Firm* — Wenderoth, Lind & Ponack, L.L.P.

(57) ABSTRACT

To provide a mounting substrate wherein insulation resistance of a metal substrate having an oxide film formed on the surface thereof is ensured, and light reflectance is improved by preventing a light-reflecting material contained in a reflection layer from diffusing into a surface of the metal substrate. A mounting substrate includes a metal substrate (21), and a surface layer section (22) formed on an upper surface of the metal substrate (21). The surface layer section (22) includes an oxide film layer (23) formed on a surface of the metal substrate (21), a barrier layer (24) formed on the oxide film layer (23), a reflection layer (25) formed on the barrier layer (24) and containing a light-reflecting material, and a protection film layer (26) formed on the reflection layer (25).

9 Claims, 2 Drawing Sheets

(51) Int. Cl.
*H01L 33/56* (2010.01)
*H01L 33/60* (2010.01)
*H01L 23/373* (2006.01)
*H01L 21/48* (2006.01)
*H01L 33/46* (2010.01)
*H01L 33/44* (2010.01)
*H01L 25/075* (2006.01)

(52) U.S. Cl.
CPC ............... *H01L 33/56* (2013.01); *H01L 33/60* (2013.01); *H01L 21/4857* (2013.01); *H01L 25/0753* (2013.01); *H01L 33/44* (2013.01); *H01L 33/46* (2013.01); *H01L 2224/48091* (2013.01); *H01L 2224/48137* (2013.01)

(56) References Cited

U.S. PATENT DOCUMENTS

| | | | |
|---|---|---|---|
| 2008/0217640 A1* | 9/2008 | Suzuki | H01L 33/405 257/98 |
| 2009/0315057 A1* | 12/2009 | Konishi | H01L 33/56 257/98 |
| 2010/0067241 A1* | 3/2010 | Lapatovich | C09K 11/02 362/361 |
| 2010/0320493 A1* | 12/2010 | Suzuki | H01L 33/60 257/98 |
| 2011/0156066 A1* | 6/2011 | Yao | H01L 33/10 257/89 |
| 2011/0278618 A1* | 11/2011 | Nakayama | H01L 33/44 257/98 |
| 2011/0278624 A1 | 11/2011 | Nam | |
| 2012/0018759 A1 | 1/2012 | Ohta | |
| 2012/0193666 A1 | 8/2012 | Namiki et al. | |
| 2015/0311403 A1* | 10/2015 | Katoh | H01L 33/486 257/98 |
| 2016/0018078 A1* | 1/2016 | Katoh | F21V 7/0066 362/296.04 |

FOREIGN PATENT DOCUMENTS

| | | |
|---|---|---|
| JP | 55-132083 | 10/1980 |
| JP | H11-342648 | 12/1999 |
| JP | 2007-067116 | 3/2007 |
| JP | 2007-129053 | 5/2007 |
| JP | 2007-194385 | 8/2007 |
| JP | 2008-226889 | 9/2008 |
| JP | 2008-263248 | 10/2008 |
| JP | 2009-258546 | 11/2009 |
| JP | 2010-34487 | 2/2010 |
| JP | 2011-3777 | 1/2011 |
| JP | 2011-193015 | 9/2011 |
| JP | 2 387 083 | 11/2011 |
| JP | 2011-243660 | 12/2011 |
| JP | 2012-49512 | 3/2012 |
| JP | 2012-174979 | 9/2012 |

OTHER PUBLICATIONS

Machine translation of JP 2009-258546 published Nov. 2009.
Machine translation of JP 2008-263248 published Oct. 2008.
International Search Report issued Jun. 4, 2013 in International (PCT) Application No. PCT/JP2013/001685.
Extended European Search Report issued Nov. 3, 2015 in corresponding European Patent Application No. 13858852.0.
Decision of Rejection drafted Dec. 9, 2015 in corresponding Japanese Patent Application No. 2014-549755 with English translation.

* cited by examiner

MOUNTING SUBSTRATE AND LIGHT-EMITTING DEVICE USING THE SAME

TECHNICAL FIELD

The present invention relates to a mounting substrate to mount light-emitting diode elements, or other semiconductor elements, more specifically, a mounting substrate of a metal base having heat resistance and heat dissipation, and a light-emitting device using the mounting substrate.

BACKGROUND ART

In a light-emitting device in which a plurality of light-emitting diode elements (hereinafter referred to as LED elements) of a high output type for illumination are mounted, semiconductor devices for communication or control or the like in which various electronic elements are densely mounted, much currents flow at the time of the light emission of the LED elements or a high speed drive, or in accordance with a load capacity to be driven. Thereby, high-temperature heat is generated. Therefore, in a conventional mounting substrate formed of a resin material of an epoxy substrate and so on, there are problems such as low heat resistance and low heat dissipation, deterioration promotion of the mounting substrate due to heat generation, and characteristic change or malfunction of the mounted LED elements or other electric elements.

To improve such problems caused by heat, in the light-emitting device for illumination or the semiconductor device of the high density, a metallic mounting substrate formed of an aluminum material having a lightweight and excellent in heat resistance and heat dissipation is often used (see, for example, Patent Literatures 1 to 3).

By the way, as a metallic mounting substrate used for such as conventional light-emitting devices for illumination, a mounting substrate including an aluminum substrate having a surface which has an oxide film formed of alumite processing and a reflection layer containing silver of a high light reflectance and formed on the surface of the aluminum substrate is often used. The mounting substrate is adapted to respond to a request of light reflectivity in addition to heat resistance and heat dissipation to a plurality of LED elements mounted on the reflection layer.

RELATED ART

Patent Literature

[Patent Literature 1] Japanese Patent Application Publication No. S55-132083
[Patent Literature 2] Japanese Patent Application Publication No. 2007-129053
[Patent Literature 3] Japanese Patent Application Publication No. 2007-194385

SUMMARY OF THE INVENTION

Technical Problems

In the mounting substrate used in the light-emitting device for illumination, it is required to increase a content rate of silver contained in the reflection layer to secure sufficient light reflectivity. However, because the reflection layer containing much silver is easily influenced by heat, the silver contained in the reflection layer is diffused into a surface of the metal substrate. As a result, the diffusion of the silver causes an insulation failure or a deterioration of the metal substrate.

On the other hand, the heat resistance of the mounting substrate is needed for the light emission of the LED elements themselves and, moreover, for continuity test under a high temperature environment executed after the LED elements are mounted on the mounting substrate. Therefore, the adjustment between the heat resistance and the light reflectance is required.

Therefore, an object of the present invention is to provide a mounting substrate wherein insulation resistance of a metal substrate having an oxide film on the surface thereof is ensured, and an improvement in light reflectance is improved by preventing a light-reflecting material contained in a reflection layer from diffusing into a surface of the metal substrate.

Solution to Problems

To solve the foregoing problems, a mounting substrate according to the present invention includes a metal substrate formed by an aluminum plate and a surface layer section formed on an upper surface of the metal substrate. The surface layer section includes an oxide film layer formed by an alumite layer and formed on a surface of the metal substrate, a barrier layer formed on the oxide film layer and containing at least one of titan, nickel, ruthenium, palladium, tungsten, and platinum, a reflection layer formed on the barrier layer and containing a light-reflecting material formed by silver, and a protection film layer formed on the reflection layer.

The barrier layer is formed on the oxide film layer to have a uniform thickness.

A light-emitting device according to the present invention includes the mounting substrate, at least one light-emitting diode element mounted on a surface of the mounting substrate, and a light-transmitting resin body that seals the light-emitting diode element.

Effects of the Invention

In the mounting substrate according to the present invention, the barrier layer is provided between the reflection layer and the metal substrate. On the surface of the metal substrate, the oxide film layer is formed. Accordingly, even under the high temperature environment, the barrier layer can prevent the light-reflecting material contained in the reflection layer from diffusing into the oxide film layer. As a result, it is possible to maintain insulation resistance of the oxide film layer.

Moreover, in the mounting substrate according to the present invention, even if the light-reflecting material contained in the reflection layer is diffused, it is possible to restrain the reduction of the light reflectance by the complementation of the barrier layer which contains a metal having a high light reflectance such as titan, nickel, ruthenium, palladium, tungsten, and platinum and so on, Furthermore, in the mounting substrate according to the present invention, because the barrier layer is formed on the oxide film layer to have a uniform thickness, it is possible to equally reflect light and equally disperse generated heat evenly and release the heat.

In addition, in the light-emitting device according to the present invention, because the mounting substrate in which the surface layer section including the barrier layer is formed on the surface of the metal substrate is used, a light-emitting device having a high durability and little aging variation can be acquired.

EMBODIMENTS OF THE INVENTION

Figure 1:
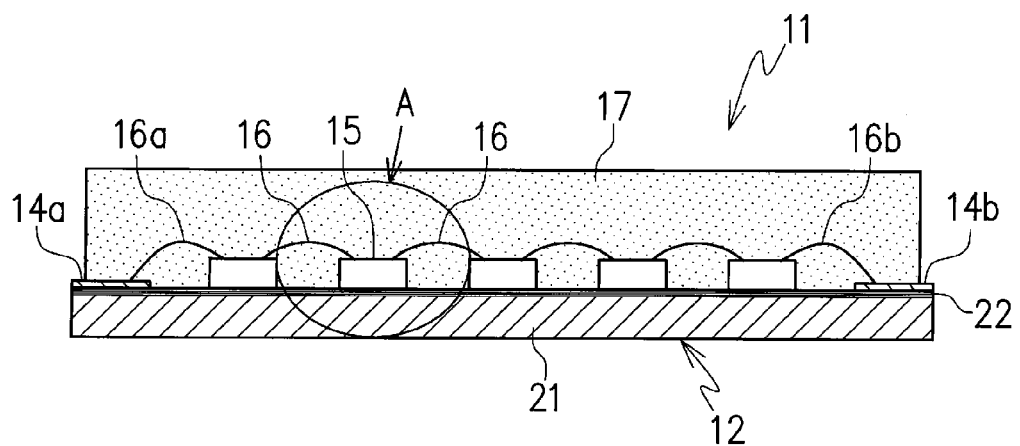
FIG. 1 is a sectional view of a mounting substrate according to a first embodiment of the present invention and a light-emitting device including the mounting substrate.

Embodiments of a mounting substrate according to the present invention and a light-emitting device using the mounting substrate will be described hereinafter with reference to the accompanying drawings. FIG. 1 illustrates the mounting substrate 12 according to a first embodiment of the present invention and the light-emitting device 11 using the mounting substrate 12. The light-emitting device 11 has a configuration in which a plurality of LED elements 15 are arranged on the mounting substrate 12 and the plurality of arranged LED elements 15 are sealed with a light-transmitting resin 17 in which phosphor is contained.

The mounting substrate 12 according to the present invention has excellent heat dissipation. This is because the mounting substrate has a structure composed of a metal substrate 21 as a base and a surface layer section 22 formed on the metal substrate 21. In addition, at least a pair of external connecting electrodes 14a and 14b is provided at outer peripheral portions of an upper surface of the mounting substrate 12.

The plurality of LED elements 15 arranged on the mounting substrate 12 include a pair of element electrodes provided on an upper surface of each of the LED elements, a lower surface of each of the LED elements is mounted on the upper surface of the mounting substrate 12 through a transparent insulation adhesive and so on. Adjacent LED elements 15 are connected each other by bonding wires 16, and the bonding wires 16a and 16b extending from the LED elements 15 positioned at opposite ends are connected to the pair of external connecting electrodes 14a and 14b. Note that one of the pair of external connecting electrodes 14a and 14b is an anode electrode and the other is a cathode electrode, each of the LED elements 15 emits by applying a predetermined voltage to each of the LED elements 15.

Figure 2:
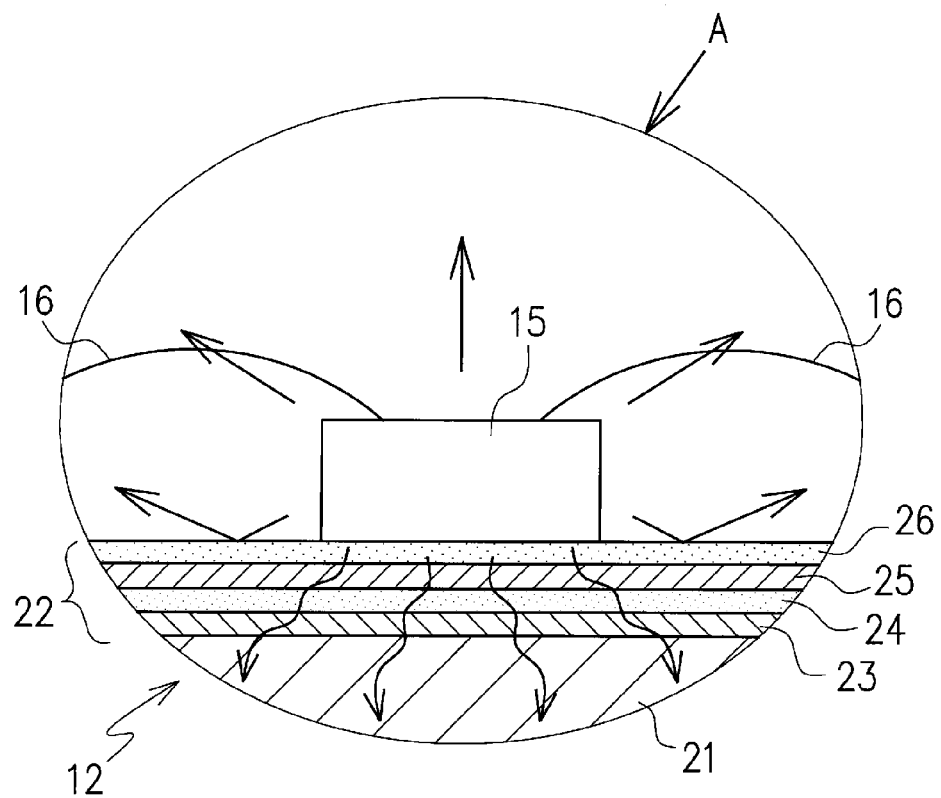
FIG. 2 is an enlarged sectional view of a portion A of the mounting substrate.

FIG. 2 is an enlarged view of a portion A in FIG. 1, and illustrates a configuration of the surface layer section 22 formed on the upper surface of the mounting substrate 12. As is clear from FIG. 2, in the surface layer section 22, an oxide film layer 23 is provided on the upper surface of the metal substrate 21 which is the base, and further a reflection layer 25 and a protection film layer 26 are provided on or above a barrier layer 24 formed on the oxide film layer 23.

The metal substrate 21 is formed of a rectangular aluminum plate having a planar area, on which the plurality of LED elements 15 is arranged. The aluminum plate has good heat dissipation because it is excellent in heat conductivity, and is excellent in heat resistance. A thickness of the aluminum plate is not limited in particular, but, in an embodiment, it is a degree of about 0.7 mm. Note that, it is not limited to the aluminum plate, if a metal material has high heat conductivity, it may be employed.

The oxide film layer 23 is composed of an alumite layer formed by applying anodization treatment to a surface of the aluminum plate as the metal substrate 21. A condition of the anodization is that the alumite layer is formed on the surface of the aluminum plate and is, in particular, not limited to this, a known technology can be adopted.

In a conventional mounting substrate in which the metal substrate is the base, heat dissipation is secured by placing mounting LED elements or semi-conductor elements on the alumite layer directly or on a reflection layer formed on the alumite layer. However, the present invention is characterized in that the barrier layer 24 is provided on the alumite layer 23 as the oxide film layer and the reflection layer 25 is provided on the barrier layer 24.

The barrier layer 24 prevents the alumite layer 23 from being corroded and deteriorated. In addition, in a case where silver as a light reflection material contained in the reflection layer 25 is diffused by influence of heat, the silver is diffused into the alumite layer 23 to generate insulation breakdown of the alumite layer 23. The barrier layer 24 is provided to prevent the insulation breakdown. The barrier layer 24 is a uniformly-thick film layer formed on a surface of the alumite layer 23. The barrier layer 24 is formed by spattering, evaporation coating, plating and so on with a metal containing at least one of titan, nickel, ruthenium, palladium, tungsten, and platinum. The formation of the uniform thickness of the barrier layer 24 makes it possible to equally reflect light emitted from the LED elements 15 and equally distribute heat by the emission of light toward the metal substrate 21. In addition, because the barrier layer 24 itself has light-reflecting effect, a fixed light-reflecting effect can be expected by the diffusion of the silver as the light reflection material.

The reflection layer 25 is formed to have a fixed thickness by diffusing silver equal to or more than 90% in purity as the light reflection material in a transparent resin and applying it on the barrier layer 24, in one embodiment. In another embodiment, the reflection layer may be formed of evaporating silver equal to or more than 90% in purity on the barrier layer 24. The purity of the silver is decided in consideration of light reflecting effect, strength of the evaporated film, affinity with other layers, and so on. The light emitted from the LED elements 15 is reflected upward by the reflection layer 25. Note that the silver used as the light reflection material is an excellent material having high heat conductivity and a high light reflectance, however, materials such as aluminum and so on other than silver having high reflectivity may be used.

The protection film layer 26 formed on the reflection layer 25 is provided as an insulation protector of a surface of the reflection layer 25. In addition, a coating is thinly formed on the reflection layer 25 by a resin material having a high light-transmitting property such as epoxy resin, acryl resin, silicone resin, fluororesin and so on not to reduce the light reflectance of the reflection layer 25. The protection film layer 26 may be configured by forming the evaporated film of titanium oxide or silicon oxide on the reflection layer 25. In addition, a multilayered protection film may be formed by optionally combining the coating of the light-transmitting resin, the evaporated film of titanium oxide, the evaporated film of silicon oxide. By forming the protection film into the multilayer, it is possible to improve the strength of the protection film itself and take measures to a pinhole(s) of the protection film. Note that in a multilayer structure in which the evaporated film the silicon oxide of a low refractive index is formed on the evaporated film of the titanium oxide of a high refractive index, if a film thickness of each layer is thin, the reduction of reflection effect is generated. As a result, it is needed to take consideration such as thickening the thickness of the film even some extent. It is possible to further improve the light reflection effect of the reflection layer 25 by mixing a light diffusing material and so on in the light-transmitting resin.

The mounting substrate 12 in which the surface layer section 22 is formed on the surface of the metal substrate 21 can efficiently releases heat generated at the time when the plurality of LED elements 15 emit light to the metal substrate 21 side. In addition, it is possible to efficiently reflect the light emitted from the plurality of LED elements 15 to an upper direction of the mounting substrate 12 by the reflection effect on the reflection layer 25. In particular, in the present invention, because the barrier layer 24 is provided on the alumite layer 23 and the reflection layer 25 is provided on the barrier layer 24, the silver in the reflection layer 25 is not diffused by heat into the alumite layer 23. Therefore, there is no possibility of the direct influence of the diffusion of the silver on the metal substrate 21. As a result, it is possible to hold a stable quality as the light-emitting device 11 throughout a long period without deteriorating characteristics of the mounting substrate 12 and the plurality of LED elements 15 mounted on the mounting substrate 12.

It is required that the mounting substrate 12, at a shipping inspection in the final process of commercialization of product, passes tests such as a continuity test and so on under a high temperature environment in which stress applied on the substrate is larger than that in a case where the product is actually used. Because the stress under such a high temperature is given to the mounting substrate 12, in particular, the reflection layer 25 easily receives influence by heat. However, the light reflectance of the reflection layer cannot be reduced because the diffusion of the silver contained in the reflection layer 25 is restrained by the barrier layer 24 positioned under the reflection layer 25. As a result, it is possible to significantly reduce generation rate of defective products and improve yield.

Figure 3:
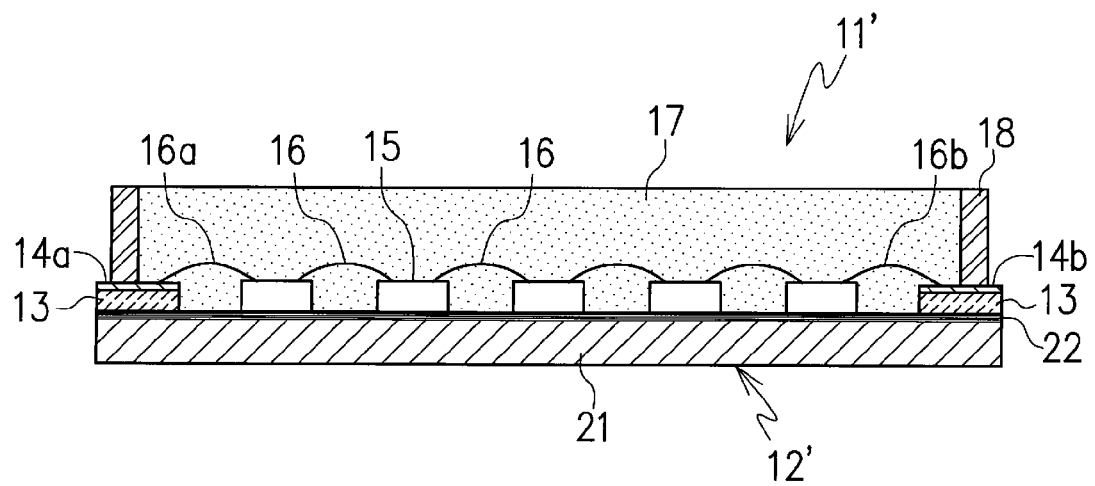
FIG. 3 is a sectional view of a mounting substrate according to a second embodiment of the present invention and a light-emitting device including the mounting substrate.

FIG. 3 illustrates a mounting substrate 12' according to a second embodiment of the present invention and a light-emitting device 11' using the mounting substrate 12. In the mounting substrate 12' according to this embodiment, the metal substrate 21 and the surface layer section 22 formed on the upper surface of the metal substrate 21 have the same configuration as that in the mounting substrate 12 according to the previous embodiment. This embodiment differs from the previous embodiment only in that a circuit substrate 13 is provided on the surface layer section 22 to surround the plurality of LED elements 15. Therefore, the identical reference numbers are attached to the similar parts, detailed descriptions thereof are omitted. Note that the at least pair of external connecting electrodes 14a and 14b are provided on an upper surface of the circuit substrate 13.

In the light-emitting device 11' according to the present embodiment, the plurality of LED elements 15 are arranged on the upper surface of the mounting substrate 12', the adjacent LED elements are connected each other by the bonding wires 16, and the bonding wires 16a and 16b extend from the LED elements 15 at the opposite ends to the external connecting electrodes 14a and 14b. In addition, the plurality of LED elements 15 arranged on the mounting substrate 12' are sealed with the light-transmitting resin 17 containing the phosphor. In addition to this, in the embodiment, the light-transmitting resin 17 is surrounded by a ring-shaped reflection frame 18. It is possible to improve light reflecting effect by forming the reflection frame 18 with a white resin.

EXPLANATION OF REFERENCE NUMERALS 11, 11' light-emitting device
12, 12' mounting substrate
13 circuit substrate
14a, 14b external connecting electrodes
15 LED elements
16a, 16b, 16c bonding wires
17 light-transmitting resin
18 reflection frame
21 metal substrate
22 surface layer section
23 oxide film layer (alumite layer)
24 barrier layer
25 reflection layer
26 protection film layer

The invention claimed is:

1. A mounting substrate comprising:
    a metal substrate formed of an aluminum plate; and
    a surface layer section formed on an upper surface of the metal substrate,
    wherein the surface layer section includes:
        an oxide film layer comprising an alumite layer, the oxide film layer being formed on the upper surface of the metal substrate;
        a barrier layer formed on the oxide film layer and containing at least one of titanium, nickel, ruthenium, palladium, tungsten, and platinum;
        a reflection layer formed on the barrier layer and containing a light-reflecting material formed of silver; and
        an insulating protection film layer formed on the reflection layer, and
    wherein the insulating protection film layer is formed of a multilayer film including a light-transmitting resin film, a titanium oxide evaporated film, and a silicon oxide evaporated film.

2. The mounting substrate according to claim 1, wherein the barrier layer formed on the oxide film layer has a uniform thickness.

3. The mounting substrate according to claim 1, wherein the reflection layer is formed of a resin film made of a light transmitting resin containing silver.

4. The mounting substrate according to claim 3, wherein the silver is 90% or more in purity.

5. The mounting substrate according to claim 1, wherein the reflection layer is formed of a silver evaporated film.

6. The mounting substrate according to claim 5, wherein the silver is 90% or more in purity.

7. The mounting substrate according to claim 1, further comprising:
    a wiring substrate having a wiring pattern, the wiring substrate being formed on end portions of an upper surface of the surface layer section.

8. A light-emitting device comprising:
    the mounting substrate claimed in claim 1;
    at least one light-emitting diode element mounted on a surface of the mounting substrate; and
    a light-transmitting resin body that seals the light-emitting diode element.

9. The light-emitting device according to claim 8, further comprising:
    a frame surrounding the light-transmitting resin body.

* * * * *